United States Patent
Chapuis

(10) Patent No.: US 7,327,149 B2
(45) Date of Patent: Feb. 5, 2008

(54) BI-DIRECTIONAL MOS CURRENT SENSE CIRCUIT

(75) Inventor: Alain Chapuis, Morgan Hill, CA (US)

(73) Assignee: Power-One, Inc., Camarillo, CA (US)

(*) Notice: Subject to any disclaimer, the term of this patent is extended or adjusted under 35 U.S.C. 154(b) by 134 days.

(21) Appl. No.: 11/126,429

(22) Filed: May 10, 2005

(65) Prior Publication Data

US 2006/0255783 A1    Nov. 16, 2006

(51) Int. Cl.
*G01R 31/08* (2006.01)
*G05F 1/00* (2006.01)

(52) U.S. Cl. ........................ 324/522; 323/282
(58) Field of Classification Search ............. 324/522, 324/771, 120
See application file for complete search history.

(56) References Cited

U.S. PATENT DOCUMENTS

| 429,581 | A | | 6/1890 | Tan |
|---|---|---|---|---|
| 3,660,672 | A | | 5/1972 | Berger et al. |
| 4,194,147 | A | | 3/1980 | Payne et al. |
| 4,204,249 | A | | 5/1980 | Dye et al. |
| 4,335,445 | A | | 6/1982 | Nercessian |
| 4,350,943 | A | * | 9/1982 | Pritchard .................... 318/696 |
| 4,451,773 | A | | 5/1984 | Papathomas et al. |
| 4,538,073 | A | | 8/1985 | Freige et al. |
| 4,538,101 | A | | 8/1985 | Shimpo et al. |
| 4,616,142 | A | | 10/1986 | Upadhyay et al. |
| 4,622,627 | A | | 11/1986 | Rodriguez et al. |
| 4,654,769 | A | | 3/1987 | Middlebrook |
| 4,677,566 | A | | 6/1987 | Whittaker et al. |

(Continued)

FOREIGN PATENT DOCUMENTS

EP    315366    5/1989

(Continued)

OTHER PUBLICATIONS

"Synchronization of Multiple Voltage Regulator Outputs," by M.W. Mueller et al. IBM Technical Disclosure Bulletin, Jun. 1999; (2 pages).

(Continued)

*Primary Examiner*—Anjan Deb
(74) *Attorney, Agent, or Firm*—O'Melveny & Myers LLP

(57) ABSTRACT

A current sensing circuit comprises a power device adapted to conduct a bidirectional current between first and second terminals thereof, first and second sensing devices operatively coupled to the power device, a sense amplifier providing first and second voltages to the first and second sensing devices, and a gate drive device providing activating signals to the power switching device and the first and second sensing devices. The first and second sensing devices each has an active area that is substantially identical and significantly smaller than a corresponding active area of the power switching device. The sense amplifier measures the voltage of the first sensing device and maintains the voltage on the second sensing device at the same level as the first sensing device by injecting an additional current into the second sensing device. The sense amplifier further provides an output signal proportional to the bidirectional current. The first and second sensing devices have k times higher resistance than a corresponding resistance of the power device when in an active state.

18 Claims, 2 Drawing Sheets

U.S. PATENT DOCUMENTS

| | | |
|---|---|---|
| 4,940,930 A | 7/1990 | Detweiler |
| 5,004,972 A | 4/1991 | Roth |
| 5,053,920 A | 10/1991 | Staffiere et al. |
| 5,073,848 A | 12/1991 | Steigerwald et al. |
| 5,079,498 A | 1/1992 | Cleasby et al. |
| 5,117,430 A | 5/1992 | Berglund |
| 5,229,699 A | 7/1993 | Chu et al. |
| 5,270,904 A | 12/1993 | Gulczynski |
| 5,272,614 A | 12/1993 | Brunk et al. |
| 5,287,055 A * | 2/1994 | Cini et al. ................. 324/768 |
| 5,349,523 A | 9/1994 | Inou et al. |
| 5,377,090 A | 12/1994 | Steigerwald |
| 5,481,140 A | 1/1996 | Maruyama et al. |
| 5,532,577 A | 7/1996 | Doluca |
| 5,627,460 A | 5/1997 | Bazinet et al. |
| 5,631,550 A | 5/1997 | Castro et al. |
| 5,646,509 A | 7/1997 | Berglund et al. |
| 5,675,480 A | 10/1997 | Stanford |
| 5,727,208 A | 3/1998 | Brown |
| 5,752,047 A | 5/1998 | Darty et al. |
| 5,815,018 A | 9/1998 | Soborski |
| 5,847,950 A | 12/1998 | Bhagwat |
| 5,870,296 A | 2/1999 | Schaffer |
| 5,872,984 A | 2/1999 | Berglund et al. |
| 5,874,912 A | 2/1999 | Hasegawa |
| 5,883,797 A | 3/1999 | Amaro et al. |
| 5,889,392 A | 3/1999 | Moore et al. |
| 5,892,933 A | 4/1999 | Voltz |
| 5,905,370 A | 5/1999 | Bryson |
| 5,917,719 A | 6/1999 | Hoffman et al. |
| 5,929,618 A | 7/1999 | Boylan et al. |
| 5,929,620 A | 7/1999 | Dobkin et al. |
| 5,935,252 A | 8/1999 | Berglund et al. |
| 5,943,227 A | 8/1999 | Bryson et al. |
| 5,946,495 A | 8/1999 | Scholhamer et al. |
| 5,990,669 A | 11/1999 | Brown |
| 5,994,885 A | 11/1999 | Wilcox et al. |
| 6,021,059 A | 2/2000 | Kennedy |
| 6,055,163 A | 4/2000 | Wagner et al. |
| 6,057,607 A | 5/2000 | Rader, III et al. |
| 6,079,026 A | 6/2000 | Berglund et al. |
| 6,100,676 A | 8/2000 | Burstein et al. |
| 6,111,396 A * | 8/2000 | Lin et al. ..................... 323/313 |
| 6,115,441 A | 9/2000 | Douglass et al. |
| 6,121,760 A | 9/2000 | Marshall et al. |
| 6,150,803 A | 11/2000 | Varga |
| 6,157,093 A | 12/2000 | Giannopoulos et al. |
| 6,157,182 A | 12/2000 | Tanaka et al. |
| 6,163,143 A | 12/2000 | Shimamori |
| 6,163,178 A | 12/2000 | Stark et al. |
| 6,177,787 B1 | 1/2001 | Hobrecht |
| 6,181,029 B1 | 1/2001 | Berglund et al. |
| 6,191,566 B1 | 2/2001 | Petricek et al. |
| 6,194,883 B1 | 2/2001 | Shimamori |
| 6,198,261 B1 | 3/2001 | Schultz et al. |
| 6,199,130 B1 | 3/2001 | Berglund et al. |
| 6,208,127 B1 | 3/2001 | Doluca |
| 6,211,579 B1 | 4/2001 | Blair |
| 6,246,219 B1 | 6/2001 | Lynch et al. |
| 6,249,111 B1 | 6/2001 | Nguyen |
| 6,262,900 B1 | 7/2001 | Suntio |
| 6,288,595 B1 | 9/2001 | Hirakata et al. |
| 6,291,975 B1 | 9/2001 | Snodgrass |
| 6,304,066 B1 | 10/2001 | Wilcox et al. |
| 6,304,823 B1 | 10/2001 | Smit et al. |
| 6,320,768 B1 * | 11/2001 | Pham et al. ................. 363/41 |
| 6,351,108 B1 | 2/2002 | Burnstein et al. |
| 6,355,990 B1 | 3/2002 | Mitchell |
| 6,385,024 B1 | 5/2002 | Olson |
| 6,392,577 B1 | 5/2002 | Swanson et al. |
| 6,396,169 B1 | 5/2002 | Voegli et al. |
| 6,396,250 B1 | 5/2002 | Bridge |
| 6,400,127 B1 | 6/2002 | Giannopoulos |
| 6,411,072 B1 | 6/2002 | Feldman |
| 6,421,259 B1 | 7/2002 | Brooks et al. |
| 6,429,630 B2 | 8/2002 | Pohlman et al. |
| 6,448,745 B1 | 9/2002 | Killat |
| 6,456,044 B1 | 9/2002 | Darmawaskita |
| 6,465,909 B1 | 10/2002 | Soo et al. |
| 6,465,993 B1 | 10/2002 | Clarkin et al. |
| 6,469,478 B1 | 10/2002 | Curtin |
| 6,469,484 B2 | 10/2002 | L'Hermite et al. |
| 6,476,589 B2 | 11/2002 | Umminger et al. |
| 6,556,158 B2 | 4/2003 | Steensgaard-Madsen |
| 6,563,294 B2 | 5/2003 | Duffy et al. |
| 6,583,608 B2 | 6/2003 | Zafarana et al. |
| 6,590,369 B2 * | 7/2003 | Burstein et al. ............. 323/272 |
| 6,608,402 B2 | 8/2003 | Soo et al. |
| 6,621,259 B2 * | 9/2003 | Jones et al. ............. 324/123 C |
| 6,683,494 B2 | 1/2004 | Stanley |
| 6,686,831 B2 | 2/2004 | Cook |
| 6,693,811 B1 | 2/2004 | Bowman et al. |
| 6,717,389 B1 | 4/2004 | Johnson |
| 6,731,023 B2 | 5/2004 | Rothleitner et al. |
| 6,744,243 B2 | 6/2004 | Daniels et al. |
| 6,771,052 B2 | 8/2004 | Ostojic |
| 6,778,414 B2 | 8/2004 | Chang et al. |
| 6,788,033 B2 | 9/2004 | Vinciarelli |
| 6,788,035 B2 | 9/2004 | Bassett et al. |
| 6,791,302 B2 | 9/2004 | Tang et al. |
| 6,791,368 B2 | 9/2004 | Tzeng et al. |
| 6,795,009 B2 | 9/2004 | Duffy et al. |
| 6,801,027 B2 | 10/2004 | Hann et al. |
| 6,807,070 B2 | 10/2004 | Ribarich |
| 6,816,758 B2 | 11/2004 | Maxwell, Jr. et al. |
| 6,819,537 B2 | 11/2004 | Pohlman et al. |
| 6,828,765 B1 | 12/2004 | Schultz et al. |
| 6,829,547 B2 | 12/2004 | Law et al. |
| 6,833,691 B2 | 12/2004 | Chapuis |
| 6,850,426 B2 | 2/2005 | Kojori et al. |
| 6,853,169 B2 | 2/2005 | Burstein et al. |
| 6,853,174 B1 * | 2/2005 | Inn .......................... 323/285 |
| 6,888,339 B1 | 5/2005 | Travaglini et al. |
| 6,903,949 B2 | 6/2005 | Ribarich |
| 6,911,808 B1 | 6/2005 | Shimamori |
| 6,915,440 B2 | 7/2005 | Berglund et al. |
| 6,917,186 B2 | 7/2005 | Klippel et al. |
| 6,928,560 B1 | 8/2005 | Fell, III et al. |
| 6,933,709 B2 | 8/2005 | Chapuis |
| 6,933,711 B2 | 8/2005 | Sutardja et al. |
| 6,947,273 B2 | 9/2005 | Bassett et al. |
| 6,963,190 B2 | 11/2005 | Asanuma et al. |
| 6,965,220 B2 | 11/2005 | Kernahan et al. |
| 6,965,502 B2 | 11/2005 | Duffy et al. |
| 6,975,494 B2 | 12/2005 | Tang et al. |
| 6,977,492 B2 | 12/2005 | Sutardja et al. |
| 7,007,176 B2 | 2/2006 | Goodfellow et al. |
| 7,023,672 B2 | 4/2006 | Goodfellow et al. |
| 2001/0033152 A1 | 10/2001 | Pohlman et al. |
| 2001/0052862 A1 | 12/2001 | Roelofs |
| 2002/0070718 A1 | 6/2002 | Rose |
| 2002/0073347 A1 | 6/2002 | Zafarana et al. |
| 2002/0105227 A1 | 8/2002 | Nerone et al. |
| 2003/0122429 A1 | 7/2003 | Zhang et al. |
| 2003/0142513 A1 | 7/2003 | Vinciarelli |
| 2003/0201761 A1 | 10/2003 | Harris |
| 2004/0027101 A1 | 2/2004 | Vinciarelli |
| 2004/0080044 A1 | 4/2004 | Moriyama et al. |
| 2004/0090219 A1 | 5/2004 | Chapuis |
| 2004/0093533 A1 | 5/2004 | Chapuis et al. |
| 2004/0123164 A1 | 6/2004 | Chapuis et al. |
| 2004/0123167 A1 | 6/2004 | Chapuis |
| 2004/0135560 A1 | 7/2004 | Kernahan et al. |
| 2004/0155640 A1 | 8/2004 | Sutardja et al. |

| | | | |
|---|---|---|---|
| 2004/0174147 | A1 | 9/2004 | Vinciarelli |
| 2004/0178770 | A1 | 9/2004 | Chapuis |
| 2004/0189271 | A1 | 9/2004 | Hansson et al. |
| 2004/0225811 | A1 | 11/2004 | Fosler |
| 2004/0246754 | A1 | 12/2004 | Chapuis |
| 2005/0093594 | A1 | 5/2005 | Kim et al. |
| 2006/0022656 | A1 | 2/2006 | Leung et al. |

FOREIGN PATENT DOCUMENTS

| | | | |
|---|---|---|---|
| EP | 0660487 | | 6/1995 |
| EP | 0875994 | | 11/1998 |
| EP | 0997825 | | 5/2000 |
| RU | 1814177 | | 5/1993 |
| SU | 1359874 | A * | 12/1987 |
| WO | WO93/19415 | | 9/1993 |
| WO | WO 01/22585 | A1 | 3/2001 |
| WO | WO02/31943 | | 4/2002 |
| WO | WO02/31951 | | 4/2002 |
| WO | WO02/50690 | | 6/2002 |
| WO | WO02/063688 | | 8/2002 |

OTHER PUBLICATIONS

"Power System Controller in an Intelligent Telecom Rectifier Plant," by U. Roth. INTELLEC 1992, pp. 476-483.

Integrity-One: Installation, Operation and Maintenance Manual Power-One, Inc., 1999-2003 Version 1.2 (P025374-P025559).

Data Sheet, Integrity-One Power System—Rack System Power-One, Inc. (P025580-P025583).

Data Sheet, "PCS Controller" Power-One, Inc. (P025584-P025585).

Data Sheet, "PMP 25 Rectifier Module" Power-One, Inc. (P025602-P025603).

33702 Microprocessor Power Supply (3.0A) Analog Products MC33702 Fact Sheet; Motorola/Digital dna/ Power Management Switching; pp. 1-4.

"Electronic Products" Power Supply Special The Engineer's Magazine of Product Technology, A Hearst Business Publication, vol. 37, No. 10, Mar. 1995, 4 pages.

"KEKB Power Supply Interface Controller Module" by A. Akiyama, T. Nakamura, M. Yoshida, T. Kubo, N. Yamamoto and T. Katoh. KEK, High Energy Accelerator Research Organization, 1-1 Ohio, Tsukuba 305, Japan International Conference on Accelerator and Large Experimental Physics and Control Systems, 1997, Beijing, China, 4 pages.

"Magnet Power Supply Control System in KEKB Accelerators" by T.T. Nakamura, A. Akiyama, T. Katoh, Ta. Kubo, N. Yamamoto, M. Yoshida. KEK, Tsukuba, Japan International Conference on Accelerator and Large Experimental Physics Control Systems, 1999, Trieste, Italy, pp. 406-408.

"Motorola Switch Mode Power Supply With Multiple Linear Regulators And High Speed CAN Transceiver" Motorola, Inc. 2002; digital dna; Analog Marketing; Rev. 2.5, Nov. 2002; 33394; Multi-Output Power Supply Semiconductor Technical Data.

"Power Management Solutions For Networking Applications"; Presented by Luc Darmon Smart Networks Developer Forum 2003—Jun. 4-6 Euro-Disney Paris, France; Motorola digital dna; www.motorola.com/sndf; pp. 1-26.

Preliminary Information 1.5 A Switch-Mode Power Supply With Linear Regulator 33701; Power Supply Integrated Circuit; Motorola Semiconductor Technical Data; Analog Marketing MC33701/D Rev. 1.0, May 2003; Motorola digital dna; pp. 1-24.

"Quantization Resolution and Limit Cycling in Digitally Controlled PWM Converters" by Angel V. Peterchev and A.V. Sanders Electrical Engineering and Computer Science; UC Berkley; Power Electronics Specialists Conference, 2001.PESC, vol. 2, Jun. 17-21, 2001, pp. 465-471; XP002274573.

"System Management Bus Specification" Smart Battery System Specifications, Revision 1.1, Dec. 11, 1998 Copyright 1996, 1997, 1998, Benchmarq Microelectronics Inc., Duracell Inc., Energizer Power Systems, Intel Corporation, Linear Technology Corporation, Maxim Integrated Products, Mitsubishi Electric Corporation, National Semiconductor Corporation, Toshiba Battery Co., Varta Batterie AG, All rights reserved, 39 pages.

"The I2C-Bus Specification"Version 2.1, Jan. 2000 Document Order No. 9398 393 40011, pp. 1-46.

"Distributed Intelligence and Modular Architecture for Next Generation DC Power System" by Louis Duguay and Pierre Got Astec Advanced Power Systems, Quebec, Canada; 6 pgs.

"Digitally-Controlled SMPS Extends Power System Capabilities" by Ron Vinsant, John DiFiore, and Richard Clarke PCIM, Jun. 1994, pp. 30-37.

"Operating and Service Manual", SBC488A Magna-Power Electronics, Inc., Dec. 19, 2002, 58 pgs.

"Operating and Service Manual", SQ Series, DC Power Supplies Magna-Power Electronics, Inc., Dec. 16, 2002, 48 pgs.

"Uniform Language for Accessing Power Plants—Human-Machine Language", ANSI TI.317-1993 American National Standards Institute, Dec. 14, 1993, 55 pages.

"An Intelligent Fault Tolerant, High Power, Distributed Power System for Massively Parallel Processing Computers" by J. Burns, J. Riel and T. DiBene IEEE, May 1994, 0-7803-1456-5/94, pp. 795-800.

"BE510/BE510S Modules"—Bipolar DC Source from 100mV to 20V and from 100nA to 4A Innovative Test Systems; BE510 Version II, Issue 9, Nov. 12, 2000, 3 pgs.

"BE52x Modules"—Multi-range bipolar DC sources from 30V to 500V, 90W Innovative Test Systems; BE52x Version A, Issue 9, Aug. 3, 2001, 3 pages.

"PCX-150A 150 Amp Pulsed Current Source Operation Manual", Version 3.0 Directed Energy, Inc., 2001, Document No. 9100-0212 R4, 31 pages.

"New Applications Demand Programmable Power Supplies/Sources" by Paul O'Shea http://www.evaluationengineering.com/archive/articles/0997powr.htm, Nelson Publishing, Inc., 1997, 8 pages.

"Market Trends Toward Enhanced Control of Electronic Power Systems" by F.M. Miles, R.K. Danak, T.G. Wilson and G.G. Suranyi IEEE, 1993, 0-7803-0982-0/93, pp. 92-98.

"R Option, S. Option DC Power Supplies", IEEE 488.2/RS-232 Programming Manual Power Ten, Document No. M550013-01 Rev C, Jun. 25, 2002, 56 pages.

"A Digitally Controlled Zero-Voltage-Switched Fullbridge Converter" by Karl-Heinz Rinne, Klaus Theml, Joseph Duigan and Oliver McCarthy Power Conversion, Jun. 1994 Proceedings, pp. 317-324.

"Volume 1: Syntax and Style" Standard Commands for Programmable Instruments (SCPI) Consortium, May 1997, Version 1997.0, 68 pages.

"Integrate Internet Solutions Into Your Energy Management Network" by Johan Sarkinen and Ola Lundin Jun. 1998, 7 pages.

"Automating the Design of a Generic Modular Power System for the Global Market" by George Pedersen, Steve Briggs, and Paul Massey Advance Power Raynham Road, Bishops Stortford, Herts.; CM23 5PF UK.

"An Operation and Maintenance Process Model for Energy Management" by Ola Lundin Ericsson Components AB, Energy Systems Division, S-164 81 KISTA—Stockholm, Sweden; 7 pages.

"Intelligent Platform Management Interface Specification v1.5" Intel, Hewlett-Packard, NEC, Dell, Document Revision 1.1, Feb. 20, 2002, 459 pages.

"Volume 2: Command Reference" SCPI Consortium, May 1997, Version 1997.0, 506 pages.

"Volume 4: Instrument Classes" SCPI Consortium, May 1997, Version 1997.0, 58 pages.

"Volume 1: Syntax and Style" SCPI Consortium, May 1999, Version 1999.0, 67 pages.

"Volume 3: Data Interchange Format" SCPI Consortium, May 1997, Version 1997.0, 73 pages.

"Volume 3: Data Interchange Format" SCPI Consortium, May 1999, Version 1999.0, 72 pages.

"Volume 4: Instrument Classes" SCPI Consortium, May 1999, Version 1999.0, 115 pages.

"Service Guide for Agilent 6610xA Power Modules" Agilent Technolgies, Agilent Part No. 5959-3364, Dec. 2002, 101 pages.

"DHP Series DC Power Supplies", IEEE 488.2/RS-232 Options Programming Manual Sorensen, Division of Elgar Electronics Corporation, Document No. M550005-01 Rev B, Jul. 29, 2002, 32 pages.

"Distributed Power Hot Swap Controller" SMH4804 Summit Microelectronics, Inc., 2050 2.3, Mar. 19, 2001, 32 pages.

"Programmer Manual", PS2520G & PS2521G Programmable Power Supplies Tektronix, 070-9197-00, 1995, 70 pages.

"User Manual", PS2520, PS2520G, PS2521 & PS2521G Programmable Power Supplies Tektronix, 070-9196-00, 1995, 56 pages.

"A Power LAN for Telecommunication Power Supply Equipment" by Nicholas Vun C.H., Lau C.T. and Lee B.S. IEEE TENCON '93 Beijing, pp. 24-27.

"VXI Bus Programmable DC Power Supplies" Advanced Power Designs, Inc., Irvine, CA; 4 pages.

"Operating Manual for Internal RS-232 Interface for XT 60 Watt and HPD 300 Watt Series Programmable DC Power Supplies" Xantrex Technology, Inc., 59 pages.

"Auto Sequence Programming Examples for GPIB-M" Xantrex Technology, Inc., Nov. 27, 2002, 1.0a, 4 pages.

"SCPI Programming Examples for GPIB-M" Xantrex Technology, Inc., Nov. 26, 2002, 1.0, 3 pages.

"Implementing a Nationwide Energy Management System" by Stig Sjöberg, Tommy Hedberg, Lars Selberg and Rober Wikström.

"IEEE Standard Codes, Formats, Protocols, and Common Commands for User with IEEE Std 488.1-1987, IEEE Standard Digital Interface for Programmable Instrumentation", IEEE Std 488.2-1992 IEEE, Jun. 18, 1992, ISBN 1-55937-238-9, 254 pages.

"Agilent E3640A—E3649A Programmable dc Power Supplies" Data Sheet Agilent Technologies, 4 pages.

"Agilent E364xA Single Output DC Power Supplies" User's Guide Agilent Technologies, Part No. E3640-90001, Jan. 2000, 207 pages.

"Optimizing Power Product Usage to Speed Design Validation Testing" Application Note 1434 Agilent Technologies, Nov. 22, 2002, 16 pages.

"Volume 2: Command Reference" SCPI Consortium, May 1999, Version 1999.0, 565 pages.

"Why have Monitoring?" by P. Shawyer, P. Hobbs and A. McLeod Texcel Technology PLC, United Kingdom.

"IMPI Intelligent Platform Management Bus Communications Protocol Specification v1.0" Intel, Hewlett-Packard, NEC, Dell, Document Revision 1.0, Nov. 15, 1999, 39 pages.

"Operating and Service Manual", MQ Series DC Power Suppkles Magna-Power Electronics, Inc., Dec. 19, 2002, 48 pages.

"User's Guide" Series 661xxA MPS Power Modules & Model 66001A MPS Keyboard Agilent Technologies, Agilent Part No. 5959-3386, Apr. 2000, 53 pages.

"Programming Guide" Series 661xxA MPS Power Modules Agilent Technologies, Agilent Part No. 5959-3362, Sep. 1997, 114 pages.

"Accelerator-Control-System Interface for Intelligent Power Supplies" by S. Cohen Los Alamos National Laboratory, pp. 183-186.

"Testing Intelligent Power Supplies for the Los Alamos National Laboratory Accelerator Complex" by J.C. Sturrock, S. Cohen, B.L. Weintraub, D.J. Hayden and S.F. Archuletta Los Alamos National Laboratory, pp. 217-219.

"Intelligent Power Supply Controller" by R.S. Rumrill and D.J. Reinagel IEEE, Aug. 1991, 0-7803-0135-8/91, PAC 1991, pp. 1537-1539.

"Magnet Power Supply as a Network Object" by S. Cohen and R. Stuewe IEEE, Aug. 1991, 0-7803-0135-8/91, PAC 1991, pp. 929-931.

"Non-Impact Printer Power and Motor Control System on a Chip" by James Masson and Steven Barrow IEEE, Apr. 1995, IEEE Catalogue No. 95TH8025, 0-7803-2423-4/95, pp. 98-103.

"Power Distribution Systems for Future Homes" by Po-Wa Lee, Yim-Shu Lee and Bo-Tao Lin IEEE, Aug. 1999, 0-7803-5769-88/99, pp. 1140-1146.

"Installation Guide" MPS Mainframe Model 66000A Agilent Technologies, Agilent Part No. 66000-90001, Apr. 2000, 26 pages.

"Power System Controller in an Intelligent Telecom Rectifier Plant" by Ueli Roth IEEE, Aug. 1992, 0-7803-0779-8/92, pp. 476-483.

"The Continuing Evolution of Intelligence for Telecommunications Power Plants" by Jimmy Godby IEEE, Apr. 1996, 0-7803-3507-4/96, pp. 70-75.

"Digitally Controlled Power Systems: How Much Intelligence is Needed and Where it Should be" by Tom Lock RELTEC Corporation, 5 pages.

"Controlling and Alarming DC Power Plants via the INTERNET" by Anthony P. Cosentino, Michael C. Sullivan, Richard V. Baxter, Jr. and Jon Loeck Power Conversion Products, LLC and Pensar Corporation, 6 pages.

"Presenting DALI" AG DALI, 2003, pp. 1-17.

"DALI Manual" DALI AG, Digital Addressable Lighting Interface Activity Group, ZVEI-Division Luminaires, 2001, pp. 1-62.

"Microchip PIC16C781/782 Data Sheet, 8-bit CMOS Microcontrollers with A/D, D/A, OPAMP, Comparators and PSMC" Microchip Technology Inc., 2001, pp. 1-184.

"Microchip AN811, The RS-232/DALI Bridge Interface" Microchip Technology Inc., 2002, DS00811A, pp. 1-8.

"Microchip AN809, Digitally Addressable DALI Dimming Ballast" Microchip Technology Inc., 2002, DS00809B, pp. 1-18.

"The Digital Addressable Lighting Interface (DALI): An Emerging Energy-Conserving Lighting Solution" by Ronat, Odile International Rectifier, Apr. 9, 2002, TP4/9/2002, pp. 1-6.

"Microchip AN703, Using the MCP320X 12-Bit Serial A/D Converter with Microchip PICmicro® Devices" Microchip Technology Inc., 2002, DS00703A, pp. 1-25.

"System Management Bus (SMBus) Specification" Version 2.0 Duracell, Inc., Energizer Power Systems, Inc., Fujitsu, Ltd., Intel Corporation, Linear Technology, Inc., Maxim Integrated Products, Mitsubishi Electric Semiconductor Company, PowerSmart, Inc., Toshiba Battery Co. Ltd., Unitrode Corporation, USAR Systems, Inc., Aug. 3, 2000, pp. 1-59.

"Fieldbus System Engineering Guidelines" Fieldbus Foundation, 2003-2004, pp. 1-94.

"Technical Overview, FOUNDATION™ fieldbus, Freedom to Choose, Power to Integrate." Fieldbus Foundation, 2003, FD-043 Rev. 3.0, pp. 1-37.

"Silicon Labs Preliminary Invalidity Contentions" Civil Action No. 2-05-CV-463 (LED)—May 26, 2006 (U.S. District Court Eastern District of Texas).

* cited by examiner

BI-DIRECTIONAL MOS CURRENT SENSE CIRCUIT

BACKGROUND OF THE INVENTION

1. Field of the Invention

The present invention relates to voltage regulator circuits, and more particularly to circuits for measuring the bidirectional current through a switching device of a switched mode voltage regulator circuit.

2. Description of Related Art

Switched mode voltage regulators (also known as switched mode power converters) are known in the art to convert an available direct current (DC) level voltage to another DC level voltage. A switched mode voltage regulator provides a regulated DC output voltage to a load by selectively storing energy in an output inductor coupled to the load by switching the flow of current into the output inductor. A buck converter is one particular type of switched mode voltage regulator that includes two power switches that are typically provided by MOSFET transistors. The power switches are referred to individually as the high side switch and the low side switch, corresponding to their placement within the buck converter as referenced to the voltage source and ground, respectively. A filter capacitor coupled in parallel with the load reduces ripple of the output current. A pulse width modulation (PWM) control circuit is used to control the gating of the power switches in an alternating manner to control the flow of current in the output inductor. The PWM control circuit uses feedback signals reflecting the output voltage and/or current level to adjust the duty cycle applied to the power switches in response to changing load conditions.

It is known to measure the output current level by sensing the current passing through a resistor coupled to the load. The voltage across the sense resistor is detected using a sense amplifier to produce a signal corresponding to the output current. This type of current sense circuit has the drawback of reducing the efficiency of the voltage regulator by the voltage drop across the sense resistor. Alternatively, it is known to use one of the power switches as a sense resistor and detect the voltage drop across the internal resistance between drain and source of the MOS device ($R_{DSON}$). This alternative approach overcomes the efficiency reduction caused by a sense resistor. Nevertheless, since the current through the power device is bidirectional, it is often difficult or impractical to measure the bi-directional current.

FIG. 1 shows an exemplary circuit 10 to measure the current $I_P$ through an MOS power device 12 having an active area A. A second MOS device 14 having an active area A/k is used to split the load current. Gate driver 16 provides the pulse modulated signal to activate the power device 12 and the second device 14. An operational amplifier 20 has a non-inverting terminal coupled to the source of the power device 12 and an inverting terminal coupled to the source of the second device 14. The operational amplifier 20 includes a feedback resistor 18 coupled between the inverting terminal and output terminal. The operational amplifier 20 maintains the source voltage of the second device 14 at the same level as the power device 12, such that the current through the second device 14 is $I_P/k$. The output terminal of the operational amplifier 20 provides sense voltage $V_{sense}$ that is proportional to the load current $I_P$. Both directions of current $I_P$ can be measured with the circuit, but it should be appreciated that the sense voltage $V_{Sense}$ will be negative with respect to the source terminal of the power device 12 for positive load currents $I_P$. This requires an auxiliary negative power supply for the operational amplifier 20, which is in many cases unavailable or costly.

Other known current sense circuits are capable of measuring a bi-directional current through a high side shunt resistor without the need for auxiliary power supplies. But, these known circuits are not suited to measure the current of a MOS power device that is continuously turned on and off. Still other known current sense circuits can measure the current through a power switch, while also suffering from limited linear operating range. These circuits are also undesirable because they require sensing devices that are scaled much larger than necessary to avoid measuring errors.

Thus, it would be advantageous to provide a bidirectional current sensing circuit for a power device that has wide linear operating range, minimal matching requirements, and fast response.

SUMMARY OF THE INVENTION

The present invention overcomes the deficiencies of the prior art by providing a current sensing circuit that measures bidirectional current through a power switching device without the need for an auxiliary negative power source.

More particularly, the current sensing circuit comprises a power device adapted to conduct a bidirectional current between first and second terminals thereof, first and second sensing devices operatively coupled to the power device, a sense amplifier providing first and second voltages to the first and second sensing devices, and a gate drive device providing activating signals to the power switching device and the first and second sensing devices. The first and second sensing devices each has an active area that is substantially identical and significantly smaller than a corresponding active area of the power switching device. The sense amplifier measures the voltage of the first sensing device and maintains the voltage on the second sensing device at the same level as the first sensing device by injecting an additional current into the second sensing device. The sense amplifier further provides an output signal proportional to the bidirectional current. The first and second sensing devices have k times higher resistance than a corresponding resistance of the power device when in an active state.

In an embodiment of the invention, the sense amplifier comprises an operational amplifier having a first input terminal coupled to the first sensing device and a second input terminal coupled to the second sensing device, a feedback transistor coupled between the first input terminal and an output of the operational amplifier, and first and second resistors coupled to the first and second input terminals, respectively. The first and second resistors may be provided by first and second matched CMOS transistors. In another embodiment of the invention, the sense amplifier comprises plural CMOS transistors.

A more complete understanding of the bidirectional current sensing circuit for a power device will be afforded to those skilled in the art, as well as a realization of additional advantages and objects thereof, by a consideration of the following detailed description of the preferred embodiment. Reference will be made to the appended sheets of drawings, which will first be described briefly.

DETAILED DESCRIPTION OF THE PREFERRED EMBODIMENT

The present invention provides a bidirectional current sensing circuit for a power device that has wide linear operating range, minimal matching requirements, and fast response. In the detailed description that follows, like element numerals are used to describe like elements illustrated in one or more figures.

Figure 1:
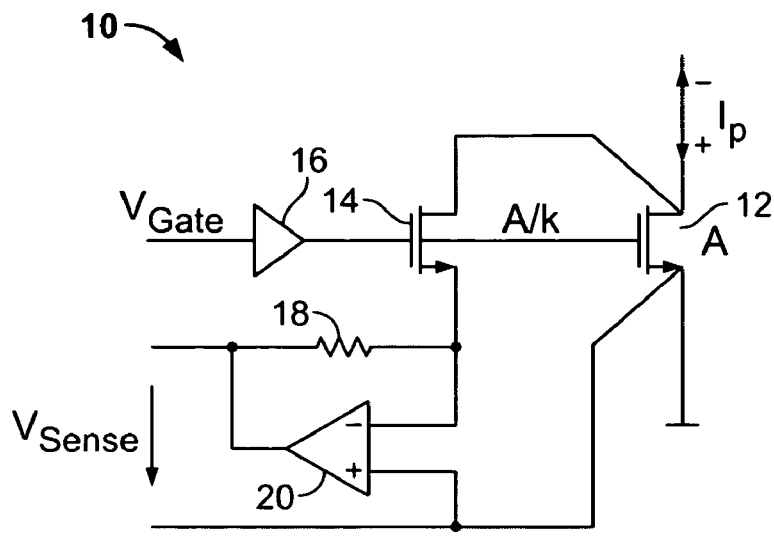
FIG. 1 depicts a prior are current sensing circuit.
Figure 2:
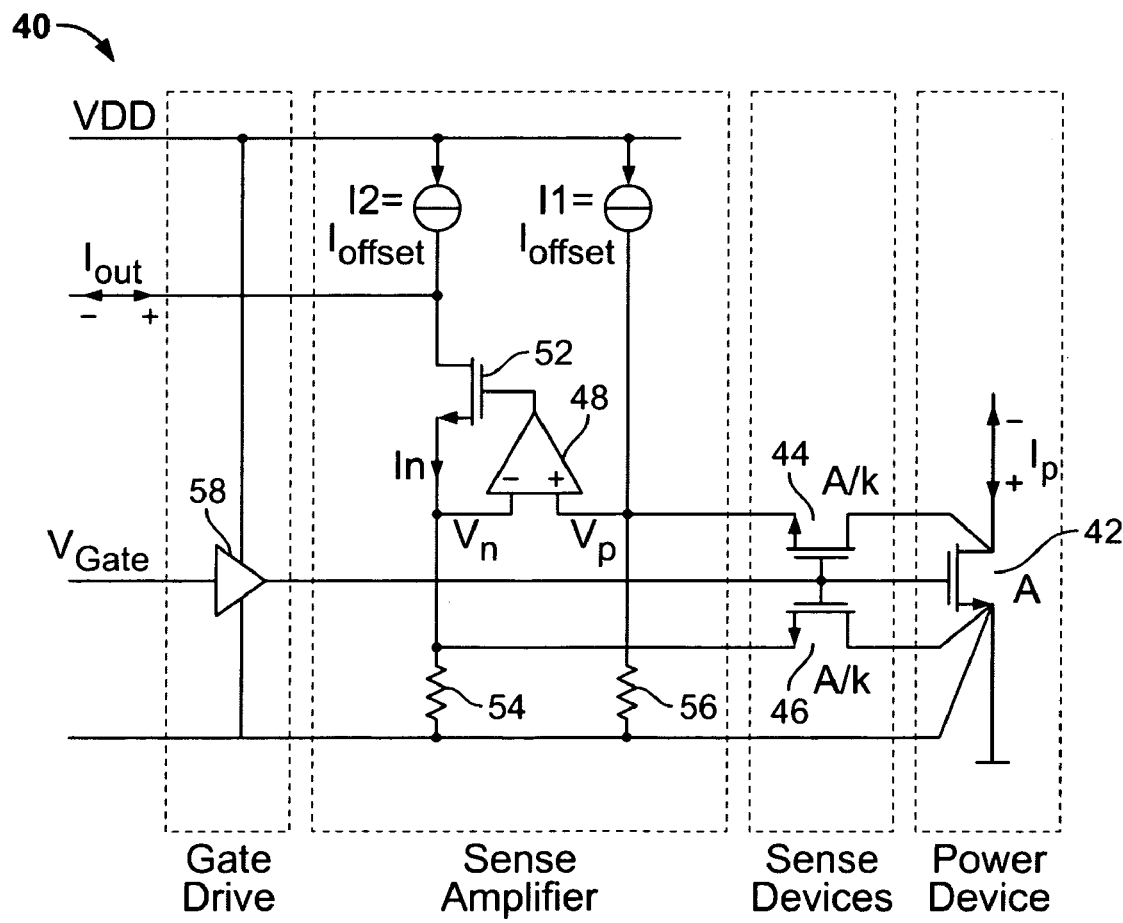
FIG. 2 depicts an exemplary bidirectional current sensing circuit in accordance with an embodiment of the invention.

FIG. 2 depicts a current sensing circuit 40 in accordance with an embodiment of the invention. The current sensing circuit 40 is divided into four parts, including: (1) the power device 42 having an active area A through which current is to be measured; (2) a pair of MOS sensing devices 44, 46 of the same type as the power device 42, but with each having a much smaller active area A/k; (3) a sense amplifier including operational amplifier 48, MOS device 52, and loading resistors 54, 56; and (4) a gate drive device 58. The gate drive device 58 applies a gate voltage to the gate terminals of power device 42 and sensing devices 44, 46 in accordance with a determined duty cycle to control their on/off states. The sensing devices 44, 46 have their drain terminals coupled respectively to the drain and source of the power device 42. The power device 42 is assumed to operate in the triode region, i.e., the device characteristic can be approximated by a low resistor with value $R_{QP}$ when in the on state. The sensing devices 44, 46 are also operated in the triode region and therefore can be assumed to have k times higher resistance ($R_{Q1}$, $R_{Q2}$) than power device 42 when turned on. In the embodiment of FIG. 2, the power device 42 corresponds to the low side switch of a switched mode power converter.

The operational amplifier 48 has a non-inverting terminal coupled to a first voltage node ($V_p$) and an inverting terminal coupled to a second voltage node ($V_n$). The first voltage node $V_p$ is coupled to the source terminal of sensing device 44 and to the drain terminal of power device 42 through resistor 56. The second voltage node $V_n$ is coupled to the source terminal of sensing device 46 and to the drain terminal of power device 42 through resistor 54. MOS device 52 provides a feedback path for operational amplifier 48, with the operational amplifier output driving the gate terminal of the MOS device 52 and the drain terminal of MOS device 52 coupled to the second voltage node Vn. A first current source I1 is defined between supply voltage VDD and first voltage node $V_p$, and a second current source I2 is defined between supply voltage VDD and source terminal of MOS device 52.

In operation, the operational amplifier 48 maintains the first voltage node $V_p$ at the same level as the second voltage node $V_n$ by injecting current $I_n$ into the node $V_n$. The second node voltage is determined as follows:

$$V_n = \frac{R_2 \cdot R_{Q2}}{R_2 + R_{Q2}} \cdot (I_{offset} + I_{out})$$

in which $R_2$ is the resistance of resistor 54 and $R_{Q2}$ is the drain-source resistance of sensing device 46. If the drain-source resistance of the power device 42 ($R_{QP}$) is much less than the drain-source resistance of sensing device 44 ($R_{Q1}$), then the positive node voltage is determined as follows:

$$V_p \approx \frac{R_{QP} \cdot R_1}{R_1 + R_{Q1}} \cdot I_P + \frac{R_1 \cdot R_{Q1}}{R_1 + R_{Q1}} \cdot I_{offset}$$

Accordingly, the feedback loop of operational amplifier 48 through MOS device 52 maintains $V_n$ equal to $V_p$, and with resistors 54, 56 equal and the drain-source resistances of sensing devices 44, 46 equal, the foregoing two equations will be equal and can be simplified to:

$$I_{out} \cdot R_{Q2} \approx I_P \cdot R_{QP}$$

and with $$R_{Q2} = k \cdot R_{QP}$$

the equation further simplifies to:

$$I_{out} \approx \frac{I_p}{k}$$

In other words, the current $I_{out}$ is proportional to the current $I_P$ through the power device 42. This equation is valid for positive and negative currents of $I_p$ as long as the current $I_n$ remains positive. In the case in which $I_{offset}$ is chosen to be larger than the maximum absolute value of $I_p/k$, the voltages $V_p$ and $V_n$ will also remain positive. It should be appreciated that this simplifies the design of the operational amplifier 48 and eliminates the need for a negative auxiliary supply for the operational amplifier. When the power device 42 is off, $I_{out}$ will be equal to zero since $R_1$ equals $R_2$ and the feedback loop maintains $V_p$ equal to $V_n$.

In an embodiment of the invention, the gate drive device 58 applies a gate voltage simultaneously to the gate terminals of power device 42 and sensing devices 44, 46. Alternatively, the gate drive device 58 may apply the gate voltage to the sensing devices 44, 46 after a certain amount of delay following application of the gate voltage to the power device 42. This delay period would ensure that the power device 42 is on before activating the sensing devices 44, 46, and thereby serve to avoid any initial voltage spikes in the measuring current.

Figure 3:
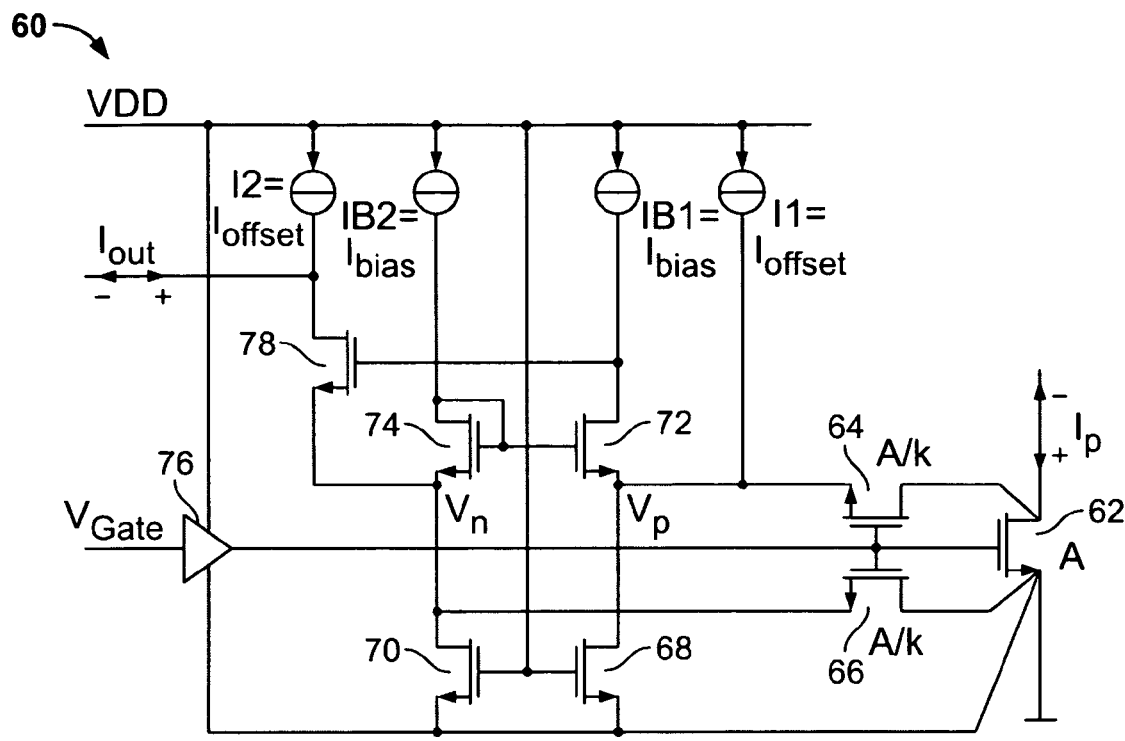
FIG. 3 depicts an exemplary bidirectional current sensing circuit for a low side power device of a switched mode voltage regulator.

FIG. 3 depicts an alternative current sensing circuit 60 that provides bi-directional current sensing within a CMOS process. As in the preceding embodiment, the circuit includes power device 62 having an active area A through which current is to be measured, and a pair of MOS sensing devices 64, 66 of the same type as the power device 62, but with each having a much smaller active area A/k. The resistors 54 (R2), 56 (R1) are replaced by CMOS transistors 70, 68 operated in the triode region. The operational amplifier 48 is replaced by CMOS transistors 74, 72 forming a simple amplifier circuit, with transistor 78 providing a feedback loop. Gate drive device 76 applies a gate voltage to the gate terminals of power device 62 and sensing devices 64, 66 in the same manner as described above. In the embodiment of FIG. 3, the power device 62 corresponds to the low side switch of a switched mode power converter.

As in the preceding embodiment, a first voltage node ($V_p$) is coupled to the source terminal of sensing device 64 and to the drain terminal of power device 42 through the drain-source resistance of transistor 68. A second voltage node $V_n$ is coupled to the source terminal of sensing device 66 and to the drain terminal of power device 62 through the drain-source resistance of transistor 70. CMOS transistors 74, 72 have respective current sources providing a bias current to source terminals thereof and to the gate of feedback transistor 78. Current source I1 provides offset current to the first voltage node $V_p$, and current source I2 provides offset current to the drain terminal of MOS device 78, which is in turn connected to the second voltage node $V_n$. The operation of the current sensing circuit 60 is generally the same as the embodiment of the FIG. 2.

From the equations derived above, it should be appreciated that R1 needs to only match R2, and that $R_{Q1}$ needs to match $R_{Q2}$ and $R_{QP}$. Therefore, transistors 68, 70 do not have to be the same type of devices MOS as sensing devices 64, 66 or power device 62. For example, transistors 68, 70 may be low voltage devices (e.g., sustaining only 5 volts), and MOS sensing devices 64, 66 and power device 62 may be devices that sustain higher voltage (e.g., 20 volts). Since power device 62 may in some applications be formed of an array of transistors connected in parallel, it would be advantageous to use two of the transistors of the array to form MOS sensing devices 64, 66 in order to achieve optimal matching. Since the active area of the MOS sensing devices 64, 66 is k times smaller (e.g., k equal to 100,000), the impact on the resistivity of the power device 62 would be minimal. It may also be advantageous to replace CMOS transistors 72, 74 with bipolar devices to minimize the offset voltage of the amplifier. This would further improve the measuring accuracy of the overall circuit.

Figure 4:
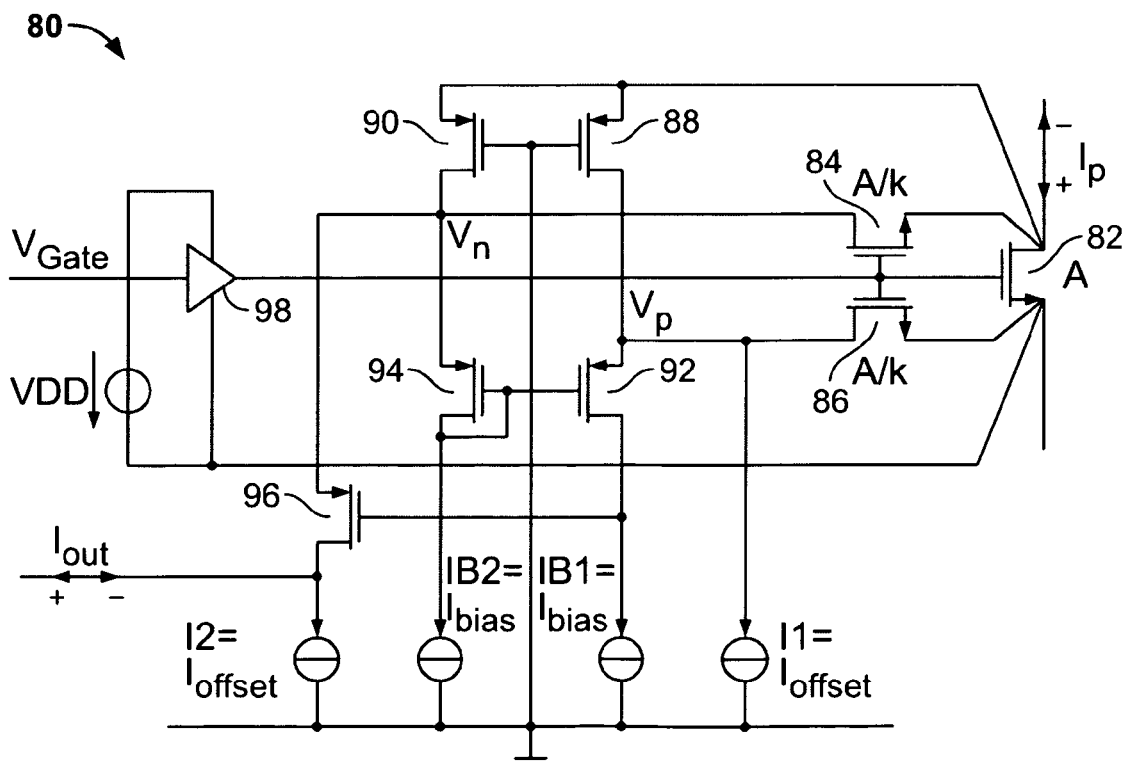
FIG. 4 depicts an exemplary bidirectional current sensing circuit for a high side power device of a switched mode voltage regulator.

FIG. 4 depicts an alternative current sensing circuit 80 that provides bi-directional current sensing within a CMOS process. In the embodiment of FIG. 4, the power device 82 corresponds to the high side switch of a switched mode power converter, with the current sensing circuit 80 providing a floating ground. As in the preceding embodiment, power device 82 has an active area A and MOS sensing devices 84, 86 each have a much smaller active area A/k. CMOS transistors 90, 88 operate in the triode region to provide the resistors R1, R2. CMOS transistors 94, 92 provide the amplifier circuit, with transistor 96 providing a feedback loop. Gate drive device 98 applies a gate voltage to the gate terminals of power device 92 and sensing devices 94, 96 in the same manner as described above.

Unlike the preceding embodiments, the orientation of the MOS sensing devices 84, 86 is reversed such that their source terminals are coupled to the drain and source of power device 82, respectively. Likewise, the orientations of CMOS transistors 90, 88, and 94, 92 are reversed in contrast to the preceding embodiment. Accordingly, a first voltage node ($V_p$) is coupled to the drain terminal of sensing device 86 and to the source terminal of power device 82 through the drain-source resistance of transistor 88, and a second voltage node ($V_n$ is coupled to the drain terminal of sensing device 84 and to the drain terminal of power device 82 through the drain-source resistance of transistor 90. The current sources I1, I2, IB1, IB2 are each referenced to ground. Otherwise, the circuit operates substantially as in the preceding embodiments. It should be appreciated that exemplary power device 82 is illustrated in this and the preceding embodiments as being an NMOS power device, although it should be appreciated that the circuit could be readily adapted by persons having ordinary skill in the art for use with a PMOS power device.

Having thus described a preferred embodiment of a circuit for measuring the bi-directional current through a switching device of a switched mode voltage regulator circuit, it should be apparent to those skilled in the art that certain advantages of the system have been achieved. It should also be appreciated that various modifications, adaptations, and alternative embodiments thereof may be made within the scope and spirit of the present invention. The invention is solely defined by the following claims.

What is claimed is:

1. A current sensing circuit comprising:
    a power device adapted to conduct a bidirectional current between first and second terminals thereof;
    a first sensing device operatively coupled to the first terminal of the power device and a second sensing device operatively coupled to the second terminal of the power device, the first and second sensing devices each having an active area that is substantially identical and significantly smaller than a corresponding active area of the power device, the first and second sensing devices providing respective first and second voltages;
    a sense amplifier operatively coupled to the first and second sensing devices, the sense amplifier measuring the first and second voltages and injecting current to the second sensing device in order to maintain the first and second voltages equal to each other, the sense amplifier further providing an output current proportional to the bidirectional current; and
    a gate drive device operatively coupled to activation terminals of the power device and the first and second sensing devices, the gate drive device providing activation signals to the power device and the first and second sensing devices.

2. The current sensing circuit of claim 1, wherein the sense amplifier comprises an operational amplifier having a first input terminal coupled to the first sensing device and a second input terminal coupled to the second sensing device, a feedback transistor coupled between the first input terminal and an output of the operational amplifier, and first and second resistors coupled to the first and second input terminals, respectively.

3. The current sensing circuit of claim 2, further comprising an offset current source adapted to inject offset current into at least one of the first and second input terminals.

4. The current sensing circuit of claim 2, wherein the first and second resistors comprise first and second matched CMOS transistors.

5. The current sensing circuit of claim 1, wherein the first and second sensing devices have k times higher resistance than a corresponding resistance of the power device when in an active state.

6. The current sensing circuit of claim 2, wherein the sense amplifier comprises plural CMOS transistors.

7. The current sensing circuit of claim 1, wherein the power device further comprises a low side switch of a switched mode voltage converter.

8. The current sensing circuit of claim 1, wherein the power device further comprises a high side switch of a switched mode voltage converter.

9. The current sensing circuit of claim 1, wherein the gate drive device provides the activation signals to the power device and the first and second sensing devices simultaneously.

10. The current sensing circuit of claim 1, wherein the gate drive device provides the activation signals to the first and second sensing devices a delay period after providing the activation signal to the power device.

11. A switched mode power converter having a power switching device and a current sensing circuit adapted to sense bidirectional current through the power switching device, the current sensing circuit further comprising:
- a first sensing device operatively coupled to the first terminal of the power device and a second sensing device operatively coupled to the second terminal of the power device, the first and second sensing devices each having an active area that is substantially identical and significantly smaller than a corresponding active area of the power switching device, the first and second sensing devices providing respective first and second voltages; and
- a sense amplifier operatively coupled to the first and second sensing devices, the sense amplifier measuring the first and second voltages and injecting current to the second sensing device in order to maintain the first and second voltages equal to each other, the sense amplifier further providing an output current proportional to the bidirectional current.

12. The switched mode power converter of claim 11, wherein the sense amplifier comprises an operational amplifier having a first input terminal coupled to the first sensing device and a second input terminal coupled to the second sensing device, a feed back transistor coupled between the first input terminal and an output of the operational amplifier, and first and second resistors coupled to the first and second input terminals, respectively.

13. The switched mode power converter of claim 12, wherein the first and second resistors comprise first and second matched CMOS transistors.

14. The switched mode power converter of claim 11, wherein the first and second sensing devices have k times higher resistance than a corresponding resistance of the power switching device when in an active state.

15. The switched mode power converter of claim 11, wherein the sense amplifier injects current into one of the first and second sensing devices.

16. The switched mode power converter of claim 11, wherein the sense amplifier comprises plural CMOS transistors.

17. The switched mode power converter of claim 11, wherein the power switching device further comprises a low side switch of the switched mode power converter.

18. The switched mode power converter of claim 11, wherein the power switching device further comprises a high side switch of the switched mode power converter.

* * * * *